United States Patent
Quist et al.

(10) Patent No.: US 10,725,133 B2
(45) Date of Patent: Jul. 28, 2020

(54) FIELD-MAPPING AND ARTIFACT CORRECTION IN MULTISPECTRAL IMAGING

(71) Applicant: The Board of Trustees of the Leland Stanford Junior University, Palo Alto, CA (US)

(72) Inventors: Brady J. Quist, Stanford, CA (US); Brian A. Hargreaves, Menlo Park, CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 538 days.

(21) Appl. No.: 15/481,749

(22) Filed: Apr. 7, 2017

(65) Prior Publication Data

US 2017/0299682 A1    Oct. 19, 2017

Related U.S. Application Data

(60) Provisional application No. 62/322,053, filed on Apr. 13, 2016.

(51) Int. Cl.
*G01R 33/483* (2006.01)
*G01R 33/56* (2006.01)
*G01R 33/24* (2006.01)
*G01R 33/565* (2006.01)

(52) U.S. Cl.
CPC ....... *G01R 33/4833* (2013.01); *G01R 33/243* (2013.01); *G01R 33/5608* (2013.01); *G01R 33/56563* (2013.01)

(58) Field of Classification Search
CPC .................................................. G01R 33/4833

USPC ......................................... 324/306, 307, 309
See application file for complete search history.

(56) References Cited

U.S. PATENT DOCUMENTS

| | | | |
|---|---|---|---|
| 8,274,286 B2 | 9/2012 | Koch et al. | |
| 8,421,459 B2 | 4/2013 | Koch | |
| 2010/0308827 A1 | 12/2010 | Koch et al. | |
| 2010/0308828 A1* | 12/2010 | Koch | G01R 33/243 324/312 |
| 2012/0082350 A1* | 4/2012 | Wollenweber | A61B 6/463 382/128 |
| 2013/0265046 A1 | 10/2013 | Koch | |

(Continued)

OTHER PUBLICATIONS

Quist, Brady "Improved Field-Mapping and Artifact Correction in Multispectral Imaging" Magnetic Resonance in Medicine, Mar. 5, 2017.

(Continued)

*Primary Examiner* — Farhana A Hoque
(74) *Attorney, Agent, or Firm* — Beyer Law Group LLP

(57) ABSTRACT

A method for generating a magnetic resonance image of an object in a magnetic resonance imaging (MRI) system, wherein the object contains at least one metallic implant is provided. The MRI system provides multiple excitations of at least part of the object. The MRI system reads out image signals from the object. The MRI system saves the readout image signals as image data. A field-map is generated from the image data using a goodness-of-fit process which uses a goodness-of-fit metric, matched-filter, and/or similar fitting techniques to fit expected signals from each excitation to the image data.

17 Claims, 11 Drawing Sheets
(8 of 11 Drawing Sheet(s) Filed in Color)

(56) References Cited

U.S. PATENT DOCUMENTS

2017/0003370 A1* 1/2017 Chen .................. G06T 7/0012
2019/0146049 A1* 5/2019 Koch .................. G01R 33/243

OTHER PUBLICATIONS

Quist, Brady "Improved Field-Map Estimation and Deblurring for MAVRIC-SL" http://submissions.mirasmart.com/ISMRM2016/ViewSubmission.aspx?sbmID=6077, Nov. 11, 2015.

* cited by examiner

FIELD-MAPPING AND ARTIFACT CORRECTION IN MULTISPECTRAL IMAGING

CROSS REFERENCE TO RELATED APPLICATIONS

This application claims priority under 35 U.S.C. § 119(e) from co-pending U.S. Provisional Application No. 62/322,053, entitled "FIELD-MAP ESTIMATION AND/OR DEBLURRING IN MULTI-SPECTRAL IMAGING MRI", filed Apr. 13, 2016.

GOVERNMENT RIGHTS

This invention was made with Government support under contracts AR063643 and EB017739 awarded by the National Institutes of Health. The Government has certain rights in the invention.

BACKGROUND OF THE INVENTION

This invention relates generally to magnetic resonance imaging (MRI). Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During MRI, each nuclear spin responds to four different effects: precession about the main magnetic field, nutation about an axis perpendicular to the main field, and both transverse and longitudinal relaxation.

SUMMARY OF THE INVENTION

In accordance with the invention, a method for generating a magnetic resonance image of an object in a magnetic resonance imaging (MRI) system, wherein the object contains at least one metallic implant is provided. The MRI system provides multiple excitations of at least part of the object. The MRI system reads out image signals from the object. The MRI system saves the readout image signals as image data. A field-map is generated from the image data using a goodness-of-fit process which uses a goodness-of-fit metric, matched-filter, and/or similar fitting techniques to fit expected signals from each excitation to the image data.

In another manifestation of the invention, a method for generating a magnetic resonance image of an object in a magnetic resonance imaging (MRI) system, wherein the object contains at least one metallic implant is provided. The MRI system provides multiple excitations of at least part of the object. The MRI system reads out image signals from the object. The MRI system saves the readout image signals as image data. A field-map is generated from the image data using a goodness-of-fit process which uses a goodness-of-fit metric and/or a matched-filter to fit expected signals from each excitation to the image data.

The invention and objects and features thereof will be more readily apparent from the following detailed description and appended claims when taken with the drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF ILLUSTRATED EMBODIMENTS

Figure 1:
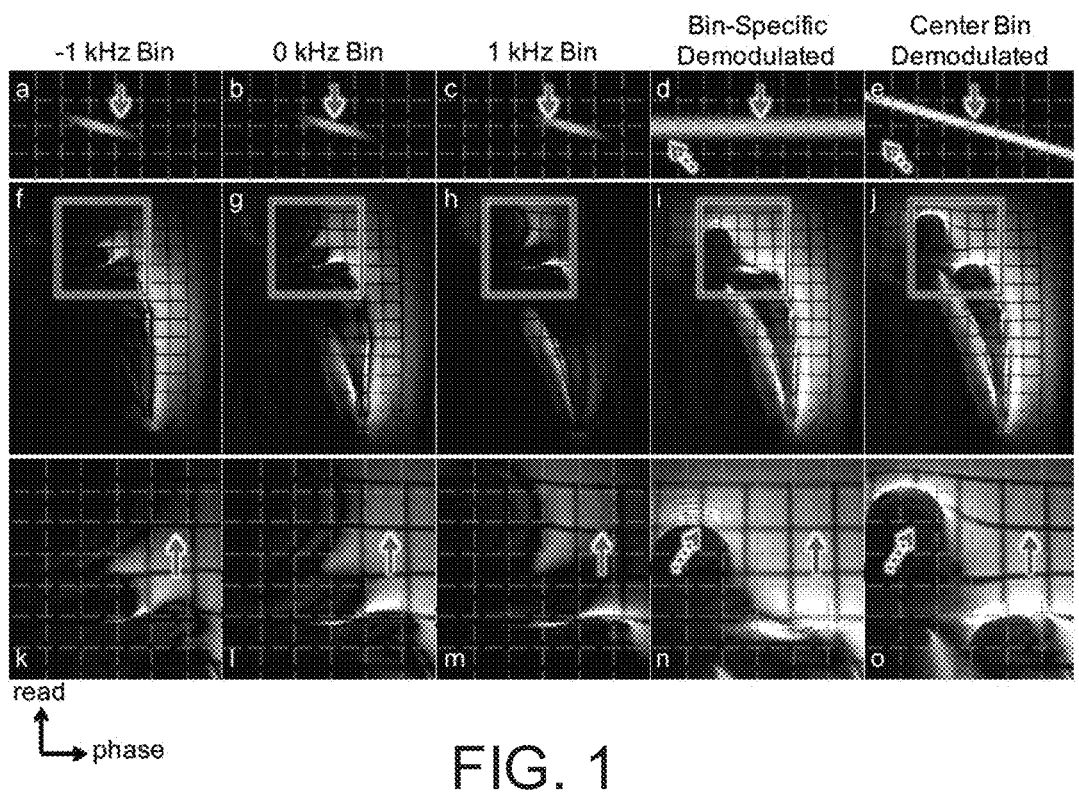
FIG. 1 is a series of multispectral images.

Magnetic Resonance Imaging (MRI) is known for its excellent soft-tissue contrast, which can be particularly useful in postsurgical examination of joint replacement surgery. However, the magnetic field inhomogeneity caused by metallic implants leads to significant artifacts in traditional MRI including distortion, signal voids, and "pile-up" artifacts throughout the entire image and particularly near the implant. While there are some techniques that reduce the extent of these artifacts, such as increasing the bandwidth per pixel, view-angle tilting (VAT), single-point imaging, dual-reversed-gradient acquisitions, prepolarized MRI, 3D-PLACE, and a balanced Steady-State Free-Precession approach, limitations of these methods inhibit their usefulness in a clinical setting.

Several more sequences have since been developed that substantially reduce most of the artifacts and address many of the prior limitations seen when imaging near metal. Specifically, a spectrally resolved three-dimensional phase-encoding method using phase-encoding in all three dimensions was used for imaging near metal to effectively remove nearly all of the artifacts. Many multispectral imaging (MSI) sequences tend to be much faster. This includes Slice Encoding for Metal Artifact Correction (SEMAC) that selectively excites 2D slices and then acquires a 3D image of each slice to eliminate through-plane distortion, while using a VAT gradient to minimize in-plane distortions. Multiple-Acquisition with Variable Resonances Image Combination (MAVRIC) is another MSI sequence that excites multiple overlapping spectral bins and acquires a 3D image of each. The 3D encoding and the limited bandwidth of the excited spectrum together help reduce distortion. Analysis of these methods has shown that they are able to visualize pathology not visible in standard MR imaging techniques.

MAVRIC-SL is a sequence that combines the strengths of both MAVRIC and SEMAC by separately exciting multiple spectral bins in conjunction with a slice-selection gradient and creating a 3D image of each using a VAT gradient. There is substantial overlap between spectral bins as neighboring bins are 1 kHz apart and excited using Gaussian RF profiles with a 2.25 kHz Full-Width Half-Max (FWHM). Each spectral bin is demodulated at the center frequency of the excited spectrum to remove the bulk shift due to the VAT gradient and off-resonance. However, this causes tissues excited in multiple spectral bins to have a slight shift between neighboring spectral bins. The acquired signal in a given bin, $s_b$, from off-resonance frequency, f, is then given as $$s_b(x, y, z, f) = s\left(x + \frac{f - f_b}{BW_p}, y, z, f\right) \cdot RF(f - f_b) \quad (1)$$

where s is the MR signal at a given location and frequency, $f_b$ is the center frequency of the bin b, $BW_p$ is the readout bandwidth per pixel, and RF is the RF excitation profile. The signal in a given bin, $s_b(x, y, z)$, is then the integral over all frequencies. Note that due to severe field inhomogeneity, multiple off-resonance frequencies can shift to the same location. While MSI sequences can fix pile-up when signal from different frequencies appear in the same voxel but in separate spectral bins, they cannot currently separate pile-up that occurs in the same voxel and bin.

Standard reconstruction often combines bin images using a simple root-sum-of-squares (RSOS) across the spectral bin dimension. While the RSOS image has no bulk distortion, it does exhibit blurring because a given frequency in a given bin is shifted by $$\frac{f - f_b}{BW_p},$$

although the blurring is limited by the RF weighting during excitation. The amount of blurring is therefore dependent on the RF profile/overlap (which is fixed in MAVRIC-SL) and the bandwidth per pixel. Conversely, when all spectral bins are demodulated at the same frequency, there will be no blurring at the expense of large distortion, because each frequency will have the same, potentially large, displacement in all spectral bins. In this situation, the amount of distortion is dependent on the off-resonance frequency and the bandwidth per pixel. This highlights one of the biggest challenges in multispectral imaging, which is the task of creating distortion-free images that minimize blurring. FIGS. 1a-o highlight this challenge in both a digital line phantom and an agar grid phantom with a hip-implant, as described below. The digital line phantom simulates a MAVRIC-SL scan of a horizontal, isointense line in the phase-encode direction with a linear off-resonance gradient ranging from −5 kHz on the left to 5 kHz on the right of the FOV.

MSI images of a digital phantom with linear off-resonance in the phase-encode direction are shown in FIGS. 1a-e and agar phantom are shown in FIGS. 1f-o demonstrating the tradeoff between blurring and distortion. The left three columns are the central MAVRIC-SL spectral bin images, each demodulated at the bin center frequency to remove large bulk distortion. The RSOS images of all bins demodulated at the bin center frequency, which blurs the images but removes bulk distortion (solid arrows), are shown in the fourth column. Conversely, the RSOS of all bin images demodulated at the same center frequency are shown in the rightmost column and exhibit deblurring with distortion in regions of off-resonance (dotted arrows). The goal of deblurring methods in MSI is to find a method that creates deblurred images without introducing distortion.

While these sequences for imaging near metal have been successful at reducing the artifacts near metallic implants, they are not without their drawbacks. Additional phase-encoding and/or sampling multiple spectral bins can significantly increase scan-time, though MSI sequences are generally much faster than three-dimensional phase-encoding methods. In addition to the blurring caused by varying readout displacements in neighboring bins/slices, as seen in MAVRIC, MAVRIC-SL and SEMAC, the latter two sequences also suffer from blurring in the readout direction caused by VAT-induced inhomogeneity across a given voxel. A deblurring algorithm has been proposed for MAVRIC-SL that estimates a field-map from the spectral bin images to calculate and undo the varying displacements seen in neighboring bins. Although this deblurring technique can be effective far away from the metal, it suffers from a biased method of field-map estimation that causes distortions in the deblurred images. The current deblurring technique is further limited by a bin combination scheme that inadequately suppresses signal from spectral bins that are far from the off-resonance estimate.

An embodiment provides a field-mapping technique that, like the SNR-optimal matched-filter estimator, estimates a field-map by finding the frequency estimate that most closely matches the profile seen in the MSI spectral bins. This improved field-map could be used for many purposes, including estimating the location and size of an implant and to reduce distortion in MSI sequences. An embodiment provides a new deblurring algorithm that performs an RF-weighted spectral bin combination to substantially reduce artifacts created by the current deblurring technique and also improve the noise performance of the method. An embodiment uses a "goodness-of-fit" measure to find a good trade-off between blurring and distortion based on the predicted accuracy of the field-map estimate. The proposed field-map estimation and deblurring algorithms are compared with current techniques in a digital phantom, a physical phantom, and in vivo.

While various embodiments are applicable to other MSI sequences, the following embodiment will focus primarily on how the proposed methods apply to the MAVRIC-SL sequence because the substantially overlapping spectral bins lead to improved field-map estimation.

Field-Map Estimation

Due to the amount of overlap between neighboring bins in MAVRIC-SL, a field-map, $f_{est,CM}$, can be estimated by calculating the center of mass of the magnitude bin images, as presented with the original MAVRIC-SL method. While this technique works well at estimating the field-map of an ideal signal, it becomes biased in the presence of noise. Specifically, as noise is introduced across all spectral bins, the calculated center of mass is influenced by the center of mass of the noise, which on average is equal to the frequency of the middle spectral bin. Consequently, a decrease in SNR not only creates noisier center-of-mass field-map estimates, but also increases their bias towards the center of the excited spectral frequencies.

In order to overcome the noise sensitivity and bias of the center-of-mass method, a matched-filter detector can be used for field-map estimation. Matched-filters are the optimal linear filters for maximizing SNR in the presence of additive stochastic noise. In this case, it essentially searches for the ideal bin signal profile by correlating the acquired spectral bin signal with the expected signal from a given off-resonance frequency. The field-map estimate is then defined as the frequency that has the largest return from the matched-filter and is given as $$f_{est,MF}(x, y, z) = \underset{f}{\mathrm{argmax}}\, MF(x, y, z, f), \quad (2)$$

$$\text{where } MF(x, y, z, f) = \sum_b s_b(x, y, z) \cdot RF(f - f_b). \quad (3)$$

Figure 2:
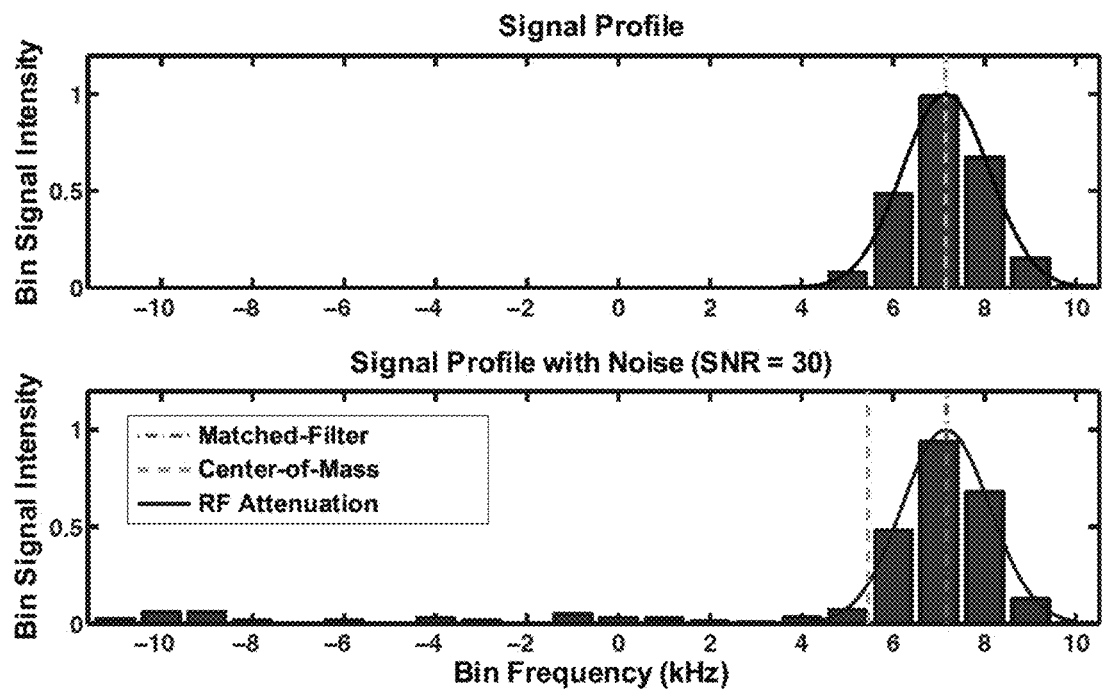
FIG. 2 shows an ideal bin signal profile across spectral bins and the same signal with added noise.

A comparison of the center-of-mass and matched-filter field-map estimates, that demonstrates the reduced bias in the matched-filter estimate in the presence of noise, is shown in FIG. 2. In FIG. 2, an ideal bin signal profile across spectral bins is shown (top) along with the same signal with added noise (bottom) and the RF profile centered on the correct off-resonance frequency (black line in both top and bottom). Both the center-of-mass and matched-filter field-map estimates are accurate in the absence of noise. However, in the presence of noise, the center-of-mass estimate becomes noticeably biased towards the frequency of the center bin, while the matched-filter estimator remains unbiased by still accurately estimating the correct off-resonance frequency.

Although the matched-filter field-map estimate is less sensitive to noise than the center-of-mass method, slight error is introduced because it does not account for the varying readout displacements experienced by a given frequency in neighboring bin images. However, accommodating the specific displacements experienced by different frequencies means that the filter would no longer be a simple 1D convolution, as a matched-filter is traditionally implemented. Instead, the acquired signal being compared is actually different for each frequency according to the bin-specific displacements caused by that frequency. Therefore, the embodiment similar to the matched-filter, looks for the spectral bin profile that most closely matches the ideal signal profile. To do this, a "goodness-of-fit" metric is defined, which determines how closely a spectral bin profile matches an expected bin profile. Let vectors $\vec{S}$ and $\vec{RF}$ be defined as $$\vec{S}(x, y, z, f) = \quad (4)$$
$$\left[ s_1\left(x - \frac{f - f_1}{BW_p}, y, z\right) s_2\left(x - \frac{f - f_2}{BW_p}, y, z\right) \ldots s_N\left(x - \frac{f - f_N}{BW_p}, y, z\right) \right]$$

and $$\vec{RF}(f) = [RF(f - f_1)\; RF(f - f_2)\; \ldots\; RF(f - f_N)], \quad (5)$$

where N is the number of spectral bins. The goodness-of-fit metric, g(x, y, z, f), between the ideal signal profile (i.e., the expected RF profile) and the acquired signal for a given voxel is $$g(x, y, z, f) = 1 - \frac{\left\| |\vec{S}(x, y, z, f)| - \alpha|\vec{RF}(f)| \right\|_2}{\alpha \|\vec{S}(x, y, z, f)\|_2 \|\vec{RF}(f)\|_2}, \quad (6)$$

where α is a scalar chosen to make the magnitudes of $\vec{S}$ and $\vec{RF}$ comparable by minimizing $\||\vec{S}(x,y,z,f)|-\alpha|\vec{RF}(f)|\|_2$. The $\| \|_2$ denotes the $L_2$-norm and was used to more heavily penalize large differences between the ideal and acquired signal profiles. This goodness-of-fit metric will then be between 0 and 1, with 0 signifying no signal overlap between $\vec{S}$ and $\vec{RF}$ and 1 occurring when $|\vec{S}|$ and $|\vec{RF}|$ are identical. A field-map estimate that takes into account the varying readout displacements can then be computed by finding the frequency that maximizes the goodness-of-fit. The goodness-of-fit field-map estimate is then $$f_{est,GF}(x, y, z) = \underset{f_{est,MF}-\Delta f \leq f \leq f_{est,MF}+\Delta f}{\max}\, g(x, y, z, f). \quad (7)$$

Note that if $\vec{S}(x, y, z, f)$ did not account for the varying shift (i.e., was a vector of $s_b(x, y, z)$), then the goodness-of-fit field-map would be identical to the matched-filter estimate. When computing the goodness-of-fit field-map, the matched-filter field-map is first calculated because it is computationally efficient and generally close to the estimate that maximizes the goodness-of-fit. This reduced the extent of the search (we used Δf=500 Hz) in the computationally intensive step of maximizing the goodness-of-fit g. The goodness-of-fit therefore helps account for the varying readout displacements and is useful in determining both the field-map as well as the reliability of the estimate.

Image Reconstruction

Current MAVRIC-SL reconstruction techniques are able to deblur the images, but produce additional artifacts in regions of large $B_0$ inhomogeneity and/or low SNR. The deblurring reconstruction originally proposed for MAVRIC-SL simply removes the bin-specific displacement from the spectral bin images that is determined by the center-of-mass field-map estimate, the bin center frequency, and the bandwidth per pixel. A deblurred image, which we call the center-of-mass reconstruction, is then created using a RSOS combination across the modified spectral bin images. Additionally, a Jacobian-based correction was proposed to correct signal intensity variations caused by field inhomogeneity; this approach was used for all deblurring reconstructions in this work.

This embodiment uses the goodness-of-fit field-map to more accurately remove the bin-specific displacement in regions where the center-of-mass field-map may be noisy or biased. Additionally, this embodiment provides an improved bin combination scheme that weights each spectral bin, on a voxel-by-voxel basis, by the expected RF profile determined by the improved field-map estimate. This creates an RF-weighted bin combination scheme whose contrast is similar to the ideal RSOS, that is the RSOS with no noise or artifacts from distant spectral bins, but includes deblurring as well. The deblurred image, which we call the goodness-of-fit reconstruction because it uses the goodness-of-fit field-map estimate, is reconstructed as $$I_{GF}(x, y, z, f_{est,GF}) = \sum_b s_b\left(x - \frac{f_{est,GF} - f_b}{BW_p}, y, z\right) \cdot RF(f_{est,GF} - f_b). \quad (8)$$

While the deblurring generally performs quite well, the deblurred images can exhibit distortion when the goodness-of-fit field-map has errors due to low SNR, parallel-imaging/motion artifacts, and/or a rapidly varying magnetic field. Therefore, this embodiment uses a novel weighted-average reconstruction, which uses the goodness-of-fit to calculate the weighted average of the RSOS bin combined image, which has blurring but no distortion, and the deblurred goodness-of-fit image, which may have distortion if the field-map is not accurate. The weighted-average reconstruction is designed to find a good trade-off between blurring and distortion that varies regionally depending on the estimated reliability of the field-map. A complete deblurring algorithm used in this embodiment is shown in FIG. 3 and is given as $$I_{WA}(x,y,z,f_{est,GF}) = g(x,y,z,f_{est,GF}) \cdot I_{GF}(x,y,z,f_{est,GF}) + (1 - g(x,y,z,f_{est,GF})) \cdot I_{RSOS}(x,y,z). \quad (9)$$

Figure 3:
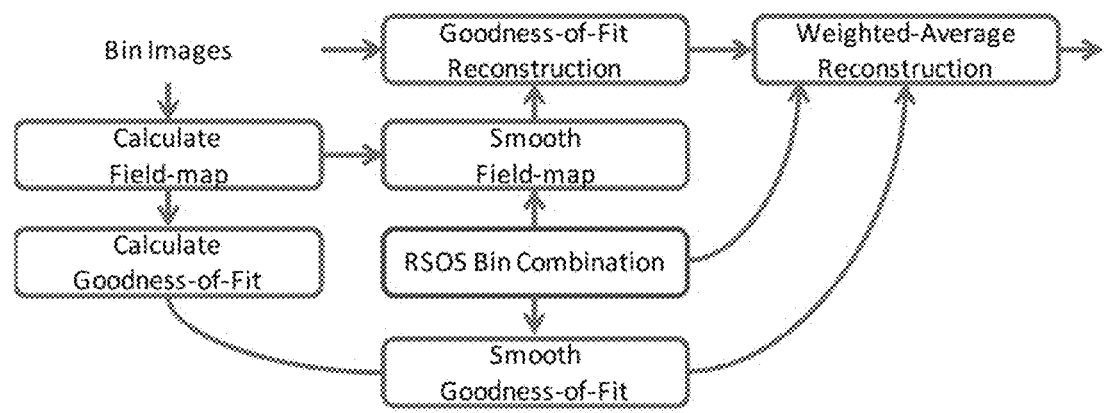
FIG. 3 illustrates a deblurring algorithm.

The weighted-average deblurring reconstruction algorithm used in this embodiment is outlined in FIG. 3. Bin images are first used to create the goodness-of-fit field-map estimate and the goodness-of-fit metric, which predicts the accuracy of the field-map estimate based on how closely the actual and expected bin signal profiles match. Using the bin images and field-map estimate, a deblurred goodness-of-fit reconstructed image is then created using the expected RF-weighted combination across bins. The weighted-average reconstruction then uses the goodness-of-fit to reduce the effects of errors in the field-map estimate, thus striking a good balance between the blurring seen in the RSOS image and distortion seen in the goodness-of-fit reconstruction when the field-map estimate is not correct.

Simulations

In order to validate the above embodiments, a 3D digital model of a total hip replacement implant (Zimmer, Inc., Warsaw, Ind., USA) was created from a 0.5 mm isotropic CT scan of the implant. The metal susceptibility was set to 182 ppm for the femoral stem (titanium alloy) and 900 ppm for the femoral head (cobalt-chromium alloy) based on literature. The susceptibility-induced field perturbations were then computed on a 0.5×0.5×2.5 mm³ grid using $$v(r) = \frac{\gamma}{2\pi} B_0 F^{-1} DF \chi(r) \quad (10)$$

where $\gamma$ is the gyromagnetic ratio, $B_0$ is the strength of main static field, F represents a Fourier Transform, $D=\frac{1}{3}-k_z^2/k^2$ is the spatial Fourier transform of the dipole field kernel, k and $k_z$ denote the radial distance and z-component of the k-space coordinates, and assuming z is the direction of $B_0$(24). The field-map was then linearly interpolated to 0.1 mm in the frequency-encode direction to better account for a range of off-resonant frequencies inside a single imaging voxel.

A simulation of a MAVRIC-SL acquisition of the digital phantom was performed assuming the implant was immersed in a substance with zero susceptibility. The effect of off-resonance was considered in the spatial encoding process of the simulation and relaxation parameters were neglected for simplification. In the simulation and all acquired datasets, 22 spectral bins were acquired covering a center frequency range of −11 to 10 kHz with 1 kHz spacing, a readout bandwidth of ±125 kHz/FOV, and matrix/FOV parameters shown in Table 1. To better visualize blurring and distortion, evenly spaced gridlines of both hyperintensity and hypointensity were created vertically and horizontally prior to the simulated image acquisition. Independent and identically distributed (i.i.d.) Gaussian noise with an SNR of 40 was also added to the simulated spectral bin images to better examine the effects of noise. This then provided a thorough simulation of a MAVRIC-SL acquisition of a hip implant, including the spectral bin profiles, to test the field-map estimation and reconstruction methods of this embodiment.

TABLE 1

| | Scan Parameters | | | | | | |
|---|---|---|---|---|---|---|---|
| | Matrix Size | FOV (cm³) | TR (s) | TE (ms) | ETL | Parallel Imaging Factor | Scan Time (minutes) | Coil |
| Digital Phantom | 490 × 240 × 30 | 24.5 × 12 × 7.5 | N/A | N/A | N/A | N/A | N/A | N/A |
| Agar Phantom | 512 × 384 × 40 | 30 × 30 × 8 | 4.0 | 7.4 | 24 | N/A | 35 | GE Head (Single Channel) |
| Agar Phantoms FIG. S1 | 384 × 256 × 24 | 30 × 24 × 7.2 | 1.6 | 6.8 | 24 | N/A | 7.4 | GE Head (8 Channel) |
| Knee | 320 × 256 × 40 | 18 × 18 × 16 | 2.9 | 7.5 | 20 | 2 × 2 | 6.6 | GE Flex (16 Channel) |
| Spine | 384 × 256 × 24 | 28 × 16.8 × 7.2 | 2.3 | 6.9 | 24 | 2 × 1 | 3.3 | Head Neck and Spine (6 Channel) |

TABLE 1-continued

Scan Parameters

Figure 8:
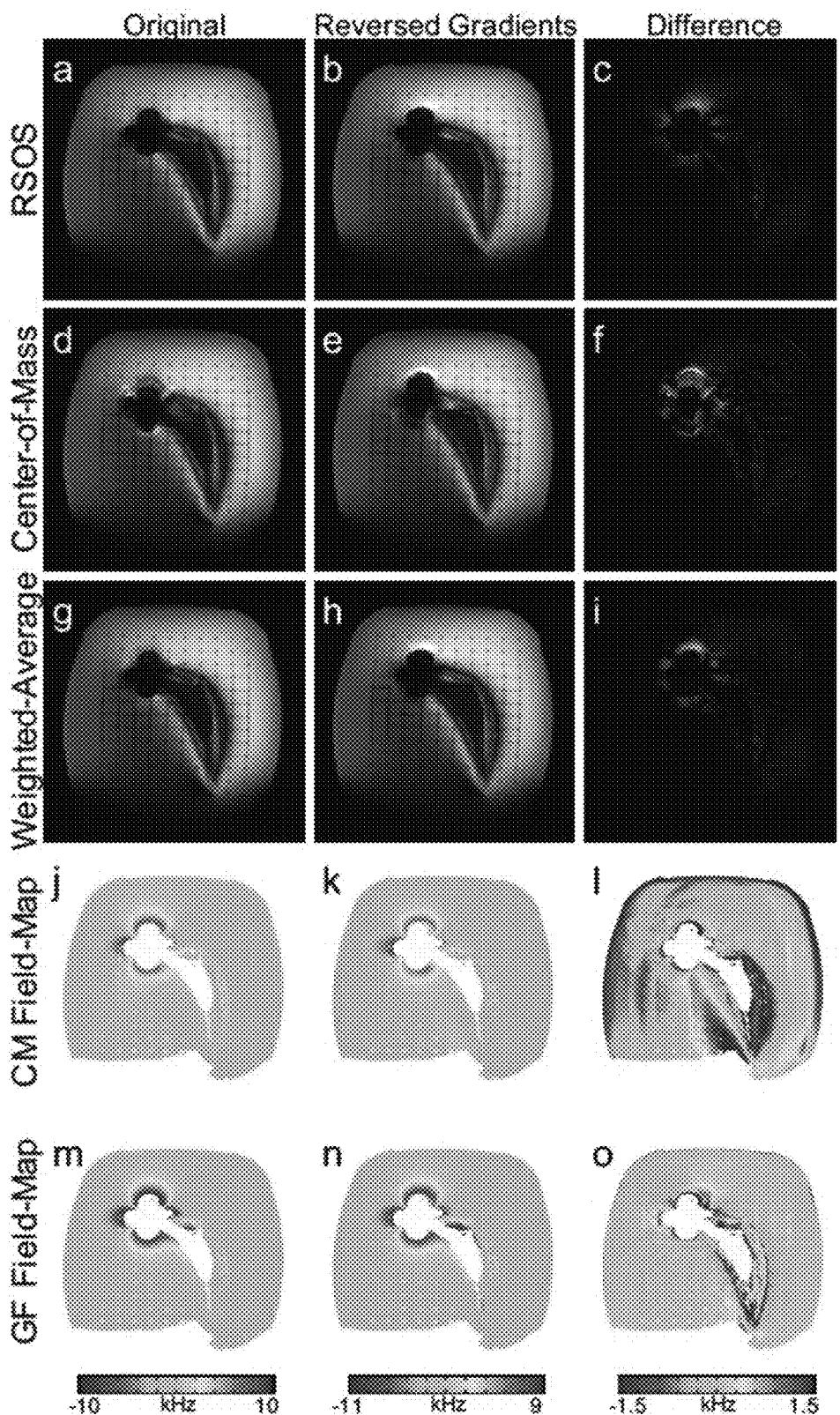
FIG. 8 shows the comparison of reconstructions and modified field-maps.

| | Matrix Size | FOV (cm³) | TR (s) | TE (ms) | ETL | Parallel Imaging Factor | Scan Time (minutes) | Coil |
|---|---|---|---|---|---|---|---|---|
| Hip 1 FIGS. 8/9 | 384 × 256 × 36 | 40 × 40 × 14.4 | 2.0 | 6.5 | 20 | 2 × 2 | 4.3 | GE Body Coil (32 Channel) |
| Hip 2 | 384 × 256 × 24 | 40 × 40 × 9.6 | 3.0 | 6.5 | 24 | 2 × 2 | 6.0 | GE HD Cardiac (8 Channel) |

To validate this embodiment, the simulated phantom data were used to estimate the field-map using the center-of-mass and the proposed goodness-of-fit methods. Both field-map estimation methods employed the same non-linear smoothing technique, which weighted each voxel based on how its magnitude RSOS signal compared to neighboring voxels; this therefore reduced the weighting of voxels with low and potentially less reliable signal. The known, simulated field-map used to produce the MAVRIC-SL simulation was also used to create error maps to visualize and compare the bias and noise of both field-map estimation techniques.

Using the estimated field-maps, deblurring was also performed on the simulated MAVRIC-SL data to assess the performance of different aspects of various embodiments. In addition to processing the center-of-mass, goodness-of-fit, and weighted-average reconstructions, two hybrid methods were also processed to compare the respective advantages afforded using the goodness-of-fit field-map and the RF-weighted bin-combination/deblurring. The first of these hybrid reconstructions uses an RSOS bin combination and the goodness-of-fit field-map estimate for deblurring. Alternatively, the other hybrid method performs the RF-weighted bin-combination, but uses the center-of-mass field-map estimate for deblurring.

Phantom Experiments

To test the methods on a physical phantom, a dedicated geometry phantom was created that contained the same hip implant used for the digital phantom and enclosed it in a three dimensional grid. The phantom grid is 15 mm in all three dimensions with a 2 mm wide edge and is made from polycarbonate using 3D printing. The space between the grid was filled with agarose gel (Bacto Agar, 2% w/v, Becton, Dickinson and Company, MD, USA), doped with 1.0 mmol/l $CuSO_4$ to reduce the $T_1$ relaxation time. MAVRIC-SL scans of the agar phantom were performed with the parameters shown in Table 1.

In addition to field-map estimation and deblurring comparisons, which were also performed on the agar phantom, an SNR analysis was performed to highlight the SNR improvements of the goodness-of-fit field-map estimation and the weighted-average reconstruction. To calculate SNR, complex i.i.d. Gaussian noise was added that resulted in an SNR ranging from approximately 5 to 100 in the hypointense and hyperintense regions, respectively, of the RSOS image of the phantom. Independent realizations of this noise were added to 200 copies of the acquired raw k-space data before processing. The magnitude of the mean error, with error being defined as the difference between the original and the noise copy, and standard deviation/SNR were then visualized to compare the SNR performance and bias of both field-mapping and reconstruction methods in different regions of the phantom.

A MAVRIC-SL scan was performed a second time with identical parameters except for the readout, slice-select, and VAT gradients were reversed in the second scan. RSOS bin combined images, center-of-mass and weighted-average deblurring reconstructions, and both the center-of-mass and goodness-of-fit field-map estimations were reconstructed for the scans acquired in both gradient directions. Because the estimated field-maps include the VAT gradient, which is different in the different scans, the field-maps were modified to remove the off-resonance caused by the prescribed VAT gradient at the center of the slice. Differences between the images and modified field-maps were then computed to compare the two scans.

In Vivo Experiments

The embodiments using the goodness-of-fit field-map estimation and weighted-average deblurring algorithms were also verified in vivo in volunteers with metallic knee, hip, and spinal implants. All phantoms/patients were scanned on a 3T scanner (General Electric Healthcare, Waukesha, Wis., and WA) and according to IRB guidelines. Additionally, all scans/reconstructions, including agar phantom scans, used a homodyne reconstruction with 52-56% k-space coverage. The scan-specific parameters are shown in Table 1. We note that while some datasets were acquired with additional bins (based on manufacturer default settings), for consistency only the indicated 22 spectral bins were included for any processing/comparisons in this work. Datasets were processed utilizing 12 parallel threads in Matlab (Mathworks, Natick, Mass., USA) using the Orchestra-Matlab interface (GE Healthcare, Waukesha, Wis., USA) on a dual CPU desktop with 16 physical cores in approximately one to two hours total for all field-maps and reconstructions. The proposed weighted-average deblurring algorithm, which includes the goodness-of-fit field-map estimation, was then compared with the current center-of-mass reconstruction technique and the original RSOS reconstructions for all subjects.

Simulations

Figure 4:
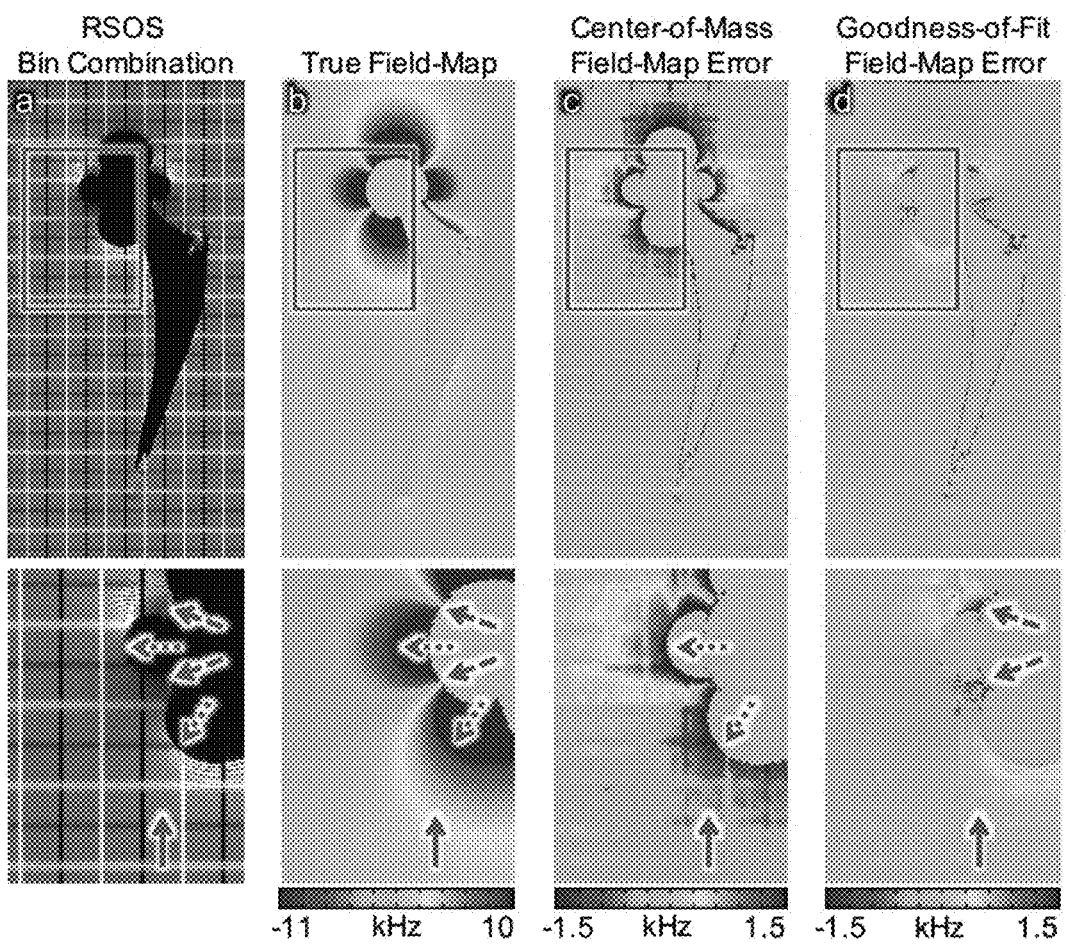
FIG. 4 shows the RSOS image of a digital phantom along with the true field-map and the error in both the center-of-mass and goodness-of-fit field-map estimations.

FIG. 4 shows the RSOS image of the digital phantom along with the true field-map and the error in both the center-of-mass and goodness-of-fit field-map estimations. A field-map comparison from a digital metallic implant phantom is shown between the center-of-mass and goodness-of-fit field-map estimations. Solid arrows indicate that the goodness-of-fit method is far less sensitive to noise added to the digital phantom than the center-of-mass method. The center-of-mass method is biased towards the center bin (i.e., 0 Hz) (dotted arrows), whereas bias in the goodness-of-fit method is far less pronounced and based on the direction and magnitude of the off-resonance gradient (dashed arrows). The goodness-of-fit field-map estimation method is clearly less biased as indicated by the dotted and dashed arrows. Additionally, the solid arrows point to a region where the center-of-mass field-map estimate is noticeably more sensitive to noise. All five deblurring reconstructions, including the weighted-average and goodness-of-fit methods of the embodiment, the center-of-mass reconstruction, and the two hybrid approaches are compared with the RSOS image in FIG. 5.

Figure 5:
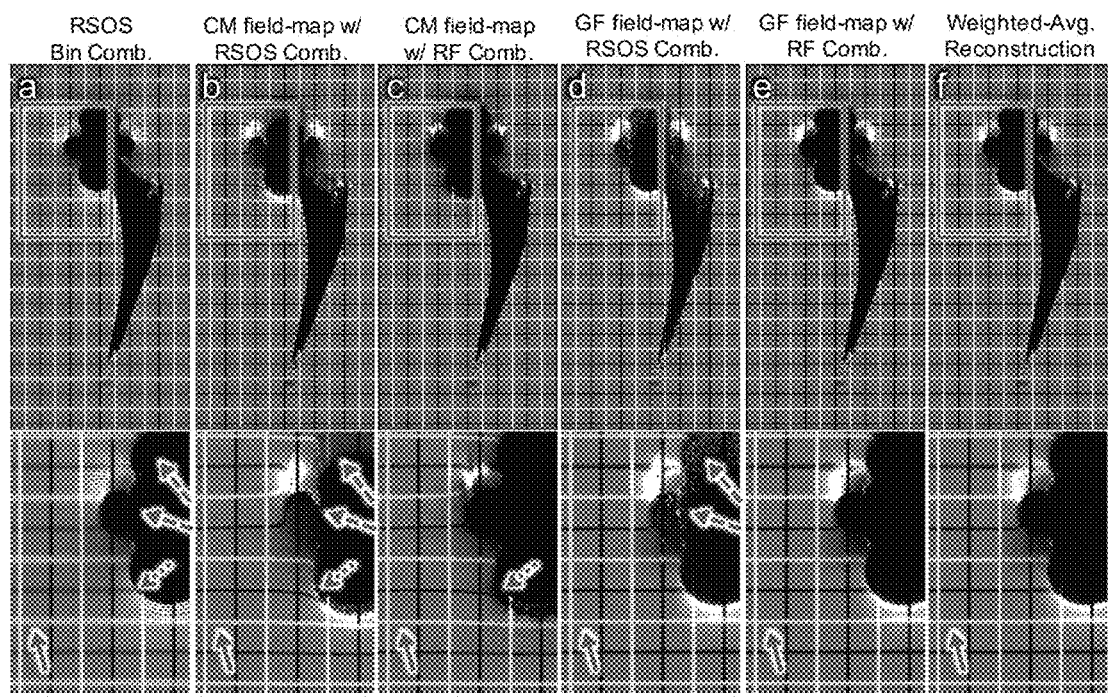
FIG. 5 shows images from a digital metallic implant phantom.

Images shown in FIG. 5 are shown from a digital metallic implant phantom processed using the RSOS bin combination for FIGS. 5a, b, and d, and the RF-weighted bin combination for FIGS. 5c and e. Both the center-of-mass field-map of FIGS. 5b and c and goodness-of-fit field-map of FIGS. 5d and e estimates were used for deblurring. The final weighted-average reconstruction is also shown in FIG. 5f. The RSOS bin combined image of FIG. 5a has no distortion but has blurring throughout the entire image. All deblurring methods deblur well in small off-resonance regions away from the metal (solid arrows). However, those that use the RSOS bin combination shown in FIGS. 5b and d can include energy from distant spectral frequencies (dashed arrows). Bias in the center-of-mass field-map estimate can create distortion during deblurring (dotted arrows). When both of these artifacts are combined in FIG. 5b, the overall image, although deblurred away from the metal, can appear worse than the blurry, undistorted version. The weighted-average reconstruction of the embodiment, on the other hand, performs well across the entire image and has substantially less distortion/artifacts than the current center-of-mass technique, shown in FIG. 5b, while still providing good deblurring. Although some pixilation artifacts in the simulated data are unrealistic, the pile-up, ripple and blurring artifacts are very similar to what is seen in phantom and human scans.

The RSOS image has blurring seen in the gridlines, which is effectively removed in all of the deblurring methods, methods that use the center-of-mass field-map estimate are subject to distortion in regions where the field-map estimate is biased. Additionally, the two methods that weight all spectral bins equally by using the RSOS for bin-combination suffer from a noticeable stretching artifact in regions of low signal.

Phantom Experiments

Figure 6:
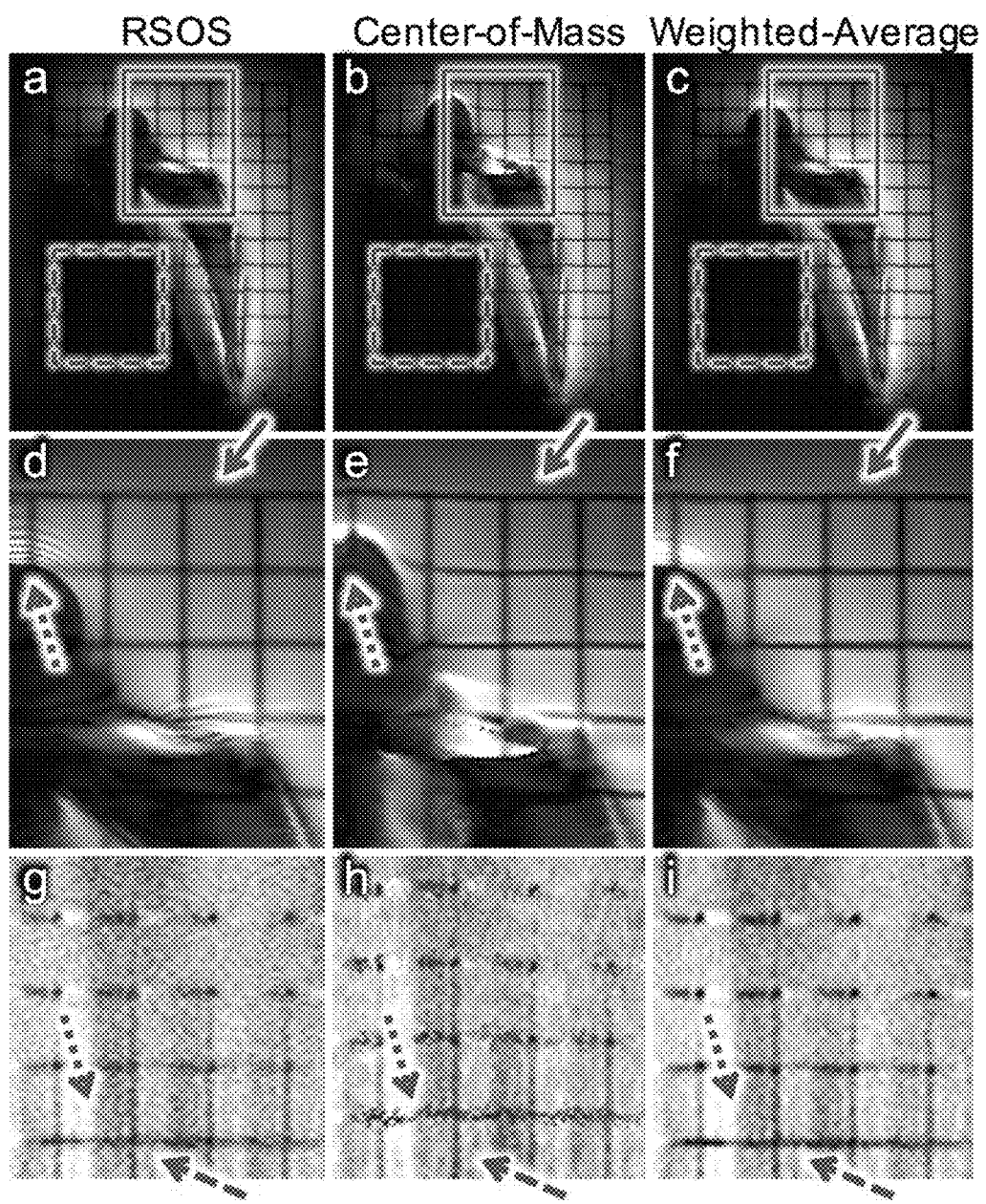
FIG. 6 shows reconstruction results from the agar grid phantom.

Reconstruction results from the agar grid phantom are shown in FIG. 6, including two zoomed images that highlight the center-of-mass reconstruction's distortion and the improved deblurring and noise performance of the proposed weighted-average deblurring algorithm. The RSOS (left column), center-of-mass (middle column), and weighted-average (right column) reconstructions of an agar grid phantom with a metallic hip implant. Zoomed in portions of a high SNR region are shown FIGS. 6d-f from the same slice as the top row. A zoomed in low SNR region from an edge slice that has a large off-resonance due to the VAT gradient is also shown FIGS. 6g-i. In regions of high SNR and low field inhomogeneity both deblurring methods perform well (solid arrows). In regions of large off-resonance the weighted-average method removes the distortion/displacement seen in the center-of-mass method due to the decreased bias in the goodness-of-fit field-map estimate (dotted arrows). For low SNR regions, the weighted-average method led to improved SNR and deblurring compared to the center-of-mass method (dashed arrows).

Figure 7:
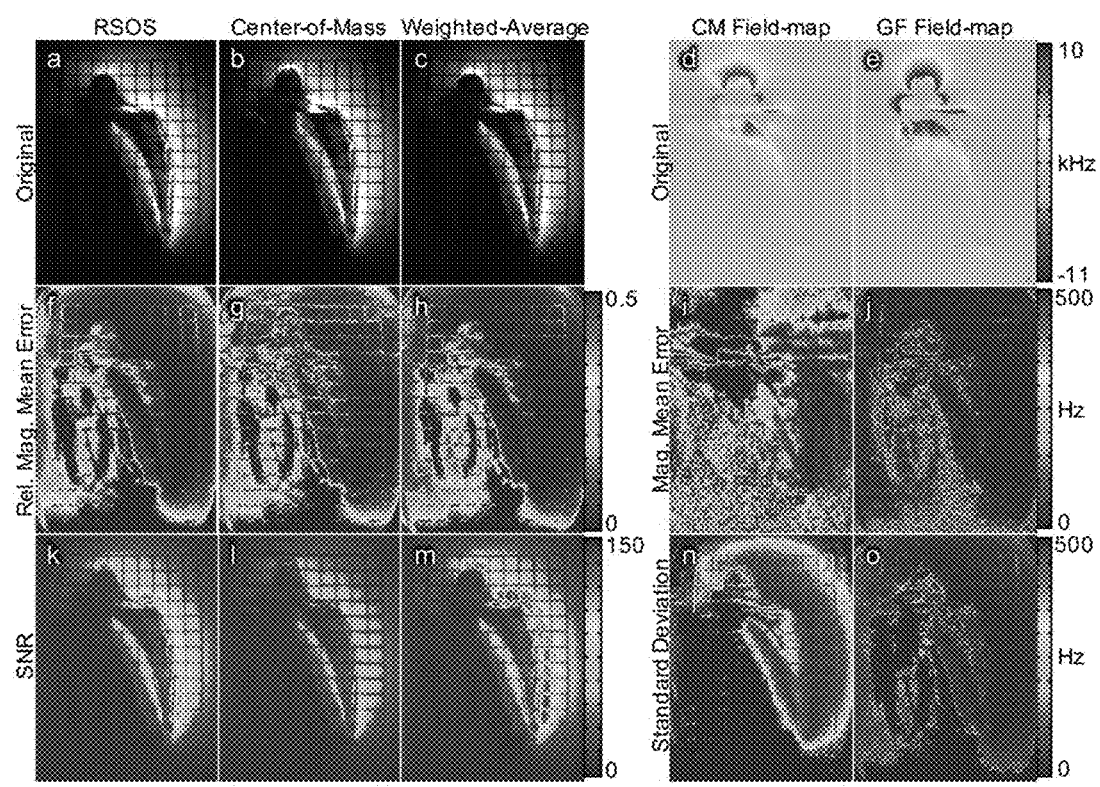
FIG. 7 shows noise analysis of an agar grid phantom with metallic implant highlights.

The noise analysis of the agar grid phantom, including SNR maps and the relative magnitude mean error (i.e., the magnitude of the mean error relative to the magnitude of the image reconstructed without added noise), is shown in FIG. 7. FIGS. 7a-o show noise analysis of an agar grid phantom with a metallic implant highlights the noise performance of the RSOS, center-of-mass, and weighted-average reconstructions. Relative magnitude mean errors shown in FIGS. 7f-h and SNR maps shown in FIGS. 7k-m show that the weighted-average method is less sensitive to noise related bias and variance than the center-of-mass method, which generally has worse performance than the RSOS technique. Additionally, noise analysis was done to compare the noise characteristics of the center-of-mass and goodness-of-fit field-map estimates. The larger range of estimated frequencies in the goodness-of-fit field-map indicates that it does not suffer from the same bias as the center-of-mass method. The magnitude mean error shown in FIGS. 7i-j and standard deviation shown in FIGS. 7n-o show that the goodness-of-fit field-map is substantially less biased and noisy than the center-of-mass field-map estimate.

The relative magnitude mean error and SNR maps both show that while all methods have high relative error and low SNR in the very low signal regions of the phantom, the weighted-average reconstruction is generally less biased and generally has a higher SNR than both the center-of-mass reconstruction and the RSOS image, with the center-of-mass method exhibiting the worst performance of the three. The magnitude mean error (relative to the estimations performed without added noise) and standard deviation of the field-map estimation techniques also show that the goodness-of-fit field-map estimate is clearly less noisy and biased than the center-of-mass field-map estimate. Additionally, while there is not a ground truth field-map for comparison, the goodness-of-fit field-map estimate calculates off-resonance values of a higher magnitude than the center-of-mass method. This indicates that the goodness-of-fit field-map is less biased because the areas adjacent to non-excited signal voids should have large off-resonance.

A comparison of the reconstructions and modified field-maps for a central slice of two MAVRIC-SL scans acquired with opposing readout, slice-select, and VAT gradients is shown in FIG. 8. RSOS (FIGS. 8a-b), center-of-mass (FIGS. 8d-e), and weighted-average (FIGS. 8g-h) reconstructions along with their differences (FIGS. 8c,f,i) are shown for two scans that differ only in the polarity of the Gx and Gz (readout, slice-select, crusher and VAT) gradients. The center-of-mass (FIGS. 8j,k) and goodness-of-fit (FIGS. 8m,n) field-map estimates, modified by removing the off-resonance of the prescribed VAT gradient, are also shown along with the difference between their respective estimates (FIGS. 8l,o). Just as in FIG. 6, which is the same phantom, both deblurring methods perform well away from the metal for both acquisitions. However, the increased range of the large difference signal in the center-of-mass reconstruction indicates that the reconstruction had distortion due to the biased center-of-mass field-map. The difference in the goodness-of-fit field-map estimates is substantially smaller than the difference in the center-of-mass estimates, which had noticeable noise throughout much of the slice. This is a strong indicator that the goodness-of-fit field-map is generally more accurate than the center-of-mass estimate.

The weighted-average reconstructions have reduced distortion compared to the center-of-mass reconstructions, near the head of the implant for both gradient directions. While the pile-up and stretching artifacts (which depend on gradient direction) cause noticeable signal in the difference RSOS and weighted-average images, the increased extent of the signal in the center-of-mass difference image indicates that the biased center-of-mass field-map led to additional artifacts in the center-of-mass reconstruction. The difference in the modified field-maps estimated from both gradient directions should be a good indicator of the accuracy of the estimation methods. While the difference of the goodness-of-fit field-map isn't perfectly zero, which would indicate a perfect field-map, the magnitude of the difference is generally much less than the center-of-mass estimate's difference. This indicates that the goodness-of-fit field-map is much more accurate.

In Vivo Experiments

Figure 9:
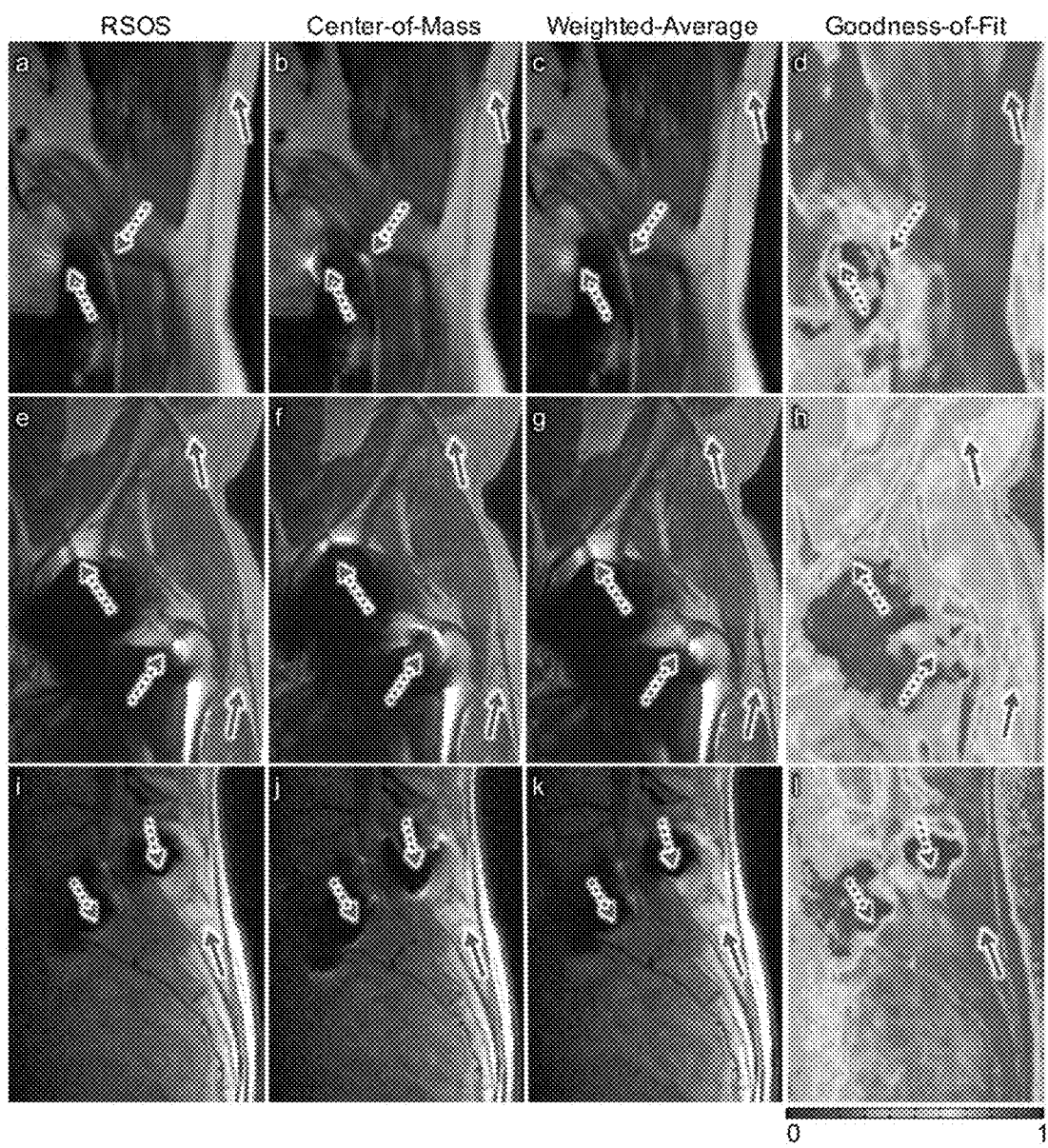
FIG. 9 shows in vivo comparisons of the RSOS bin combined images with both the center-of-mass and weighted-average deblurring reconstructions along with the goodness-of-fit maps for volunteers.

FIG. 9 shows in vivo comparisons of the RSOS bin combined images with both the center-of-mass and weighted-average deblurring reconstructions along with the goodness-of-fit maps for volunteers with knee, hip, and spinal metallic implants. RSOS, center-of-mass, and weighted-average reconstructions of MAVRIC-SL data along with the calculated goodness-of-fit metric are shown for subjects with knee (FIGS. 9a-d), hip (FIGS. 9e-h), and spinal (FIGS. 9i-l) implants. Solid arrows indicate regions where both the center-of-mass and the weighted-average reconstructions deblur the image well. The weighted-average reconstruction is able to perform deblurring without introducing the severe distortion seen in the center-of-mass method (dotted arrows). The goodness-of-fit images also show that even images with a relatively low goodness-of-fit (FIG. 9h) are still able to produce weighted-average reconstructions (FIG. 9g) that deblur well across the entire image without introducing any noticeable distortion.

In all three anatomies, solid arrows indicate regions away from the metallic implant where both deblurring methods perform well at deblurring and have no noticeable distortion. However, the weighted-average deblurring algorithm of the embodiment performs substantially better near the implant by reducing the distortion caused by biased field-map estimates and summing the signal equally across all spectral bins as shown by the dotted arrows. While the goodness-of-fit measurement for these particular spine and knee images are noticeably better than the hip image, the deblurring appears to still be quite good in the weighted-average hip image without introducing any noticeable distortion.

Figure 10:
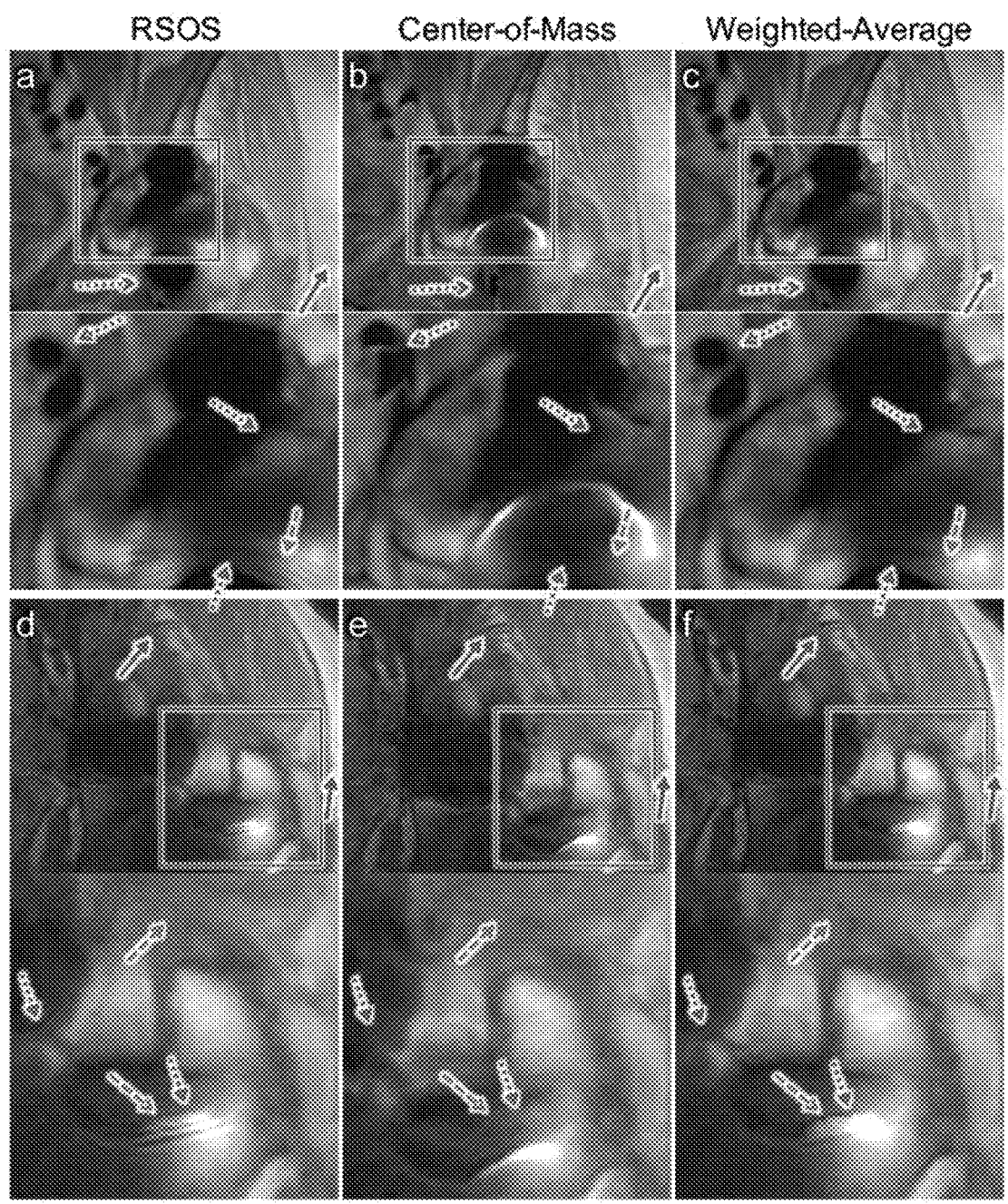
FIG. 10 shows RSOS, center-of-mass, and weighted-average recon tractions of two separate subjects with metallic hip implants.

While the artifacts introduced by the weighted-average reconstruction were minor, in both appearance and frequency, relative to those of the center-of-mass method, we did identify three types of slight artifacts that it introduced. All three are shown in FIG. 10 along with a comparison to the RSOS and center-of-mass methods. RSOS, center-of-mass, and weighted-average reconstructions of two separate subjects with metallic hip implants are shown to visualize artifacts created by both deblurring methods. Solid red arrows point to regions where both deblurring methods produced adequate deblurring. Dotted red arrows point to regions where the proposed weighted-average reconstruction had good deblurring while reducing distortions. Dashed blue arrows point to three types of artifacts seen occasionally by the weighted-average images, including: 1) a single voxel with incorrect field-map estimation due to uncertainty in a quickly varying magnetic field is shown in FIG. 10c. 2) Slight hypointense patterns when the estimated field-map has a sharp discontinuity indicated by the upper dashed blue arrow in FIG. 10f, this occurred because the acquired spectral profile was bimodal. 3) Slight blocky appearance at large signal boundaries is due to sharp discontinuity in estimated field-map indicated by the lower blue dashed arrows in FIG. 10f. While these are among the worst of the artifacts associated with the weighted-average method, the images still exhibit excellent deblurring with considerably less distortion than the center-of-mass method.

The dashed blue arrow in FIG. 10c points to a voxel with substantial error in the field-map estimate, resulting in a reconstructed dark voxel. In FIG. 10, the top blue dashed arrow points to a region where the estimated field-map had a sharp discontinuity, due to a bimodal spectral bin profile, that created minor hypointense patterns. The lower blue dashed arrow in FIG. 10f points to a region that while deblurred correctly, has a blocky appearance on the tissue boundary due to a sharp discontinuity in the estimated field-map caused by the incorrect field-map estimate in the low signal region. While these artifacts are among the worst that we have seen in the weighted-average reconstructions of the five patients that we have analyzed, they are relatively infrequent and are much less noticeable than the large scale distortions that are ubiquitous in the center-of-mass method and shown with dotted red arrows in FIGS. 6, 9, and 10. Furthermore, the good deblurring performance of the weighted-average method indicated by solid red arrows in FIGS. 6, 9, and 10 is consistent across all five patients analyzed.

Using simulations and noise experiments we have confirmed that the goodness-of-fit field-map estimation in various embodiments is substantially less sensitive to noise and less prone to bias than the current center-of-mass approach. A comparison of the differences in the field-maps shown in FIG. 8 strongly indicates that the proposed goodness-of-fit field-map is more accurate and less biased than the center-of-mass field-map. Additionally, the simulations and noise experiments validate the reduced distortion, higher SNR and comparable deblurring of the weighted-average deblurring reconstruction, when compared to the current center-of-mass reconstruction. Similarly, in vivo comparisons of the deblurring method of various embodiments in the knee, hip, and spine, in addition to the agar grid phantom, show that the weighted-average deblurring method has substantially less distortion than the current center-of-mass technique. While this analysis was applied directly to MAVRIC-SL, the general problem of trying to find the right trade-off between blurring and distortion is applicable to all current MSI sequences including SEMAC, MAVRIC, and the more recent 2D MSI approach.

Field-Map Bias

While the goodness-of-fit field-map has substantially less bias and noise sensitivity than the center-of-mass estimate, the regions of bias differ from those of the center-of-mass method. FIG. 4 shows that the center-of-mass field-map estimation method is most biased when the true field-map has the highest off-resonance. The goodness-of-fit field-map estimate on the other hand, appears to have some bias when the field-map varies quickly in the readout direction, most likely due to pile-up and stretching within a single spectral bin. Both observations were further validated in the difference between the modified field-maps estimated from the reversed gradients. Specifically, the difference in the center-of-map field-maps became increasingly more biased as the slice moved further from the center (not shown). The difference in the weighted-average reconstruction, on the other hand, showed no such large-scale bias, but did show some error in regions of large field inhomogeneity in the readout direction as seen in FIG. 8. The weighted-average reconstruction is able to account for some of the errors in the field-map estimate by using the goodness-of-fit metric.

Artifacts

The center-of-mass reconstruction works well when the estimated field-map is accurate and slowly varying. However, when the estimated field-map is not accurate, the local regions of the image may be deblurred, because there is no relative shift between bins, but they will also be distorted as the bulk shift is not correct. Additionally, when $B_0$ changes rapidly, $$x - \frac{f_{est,CM} - f_b}{BW_p}$$

may be the same for multiple values of x within the same readout column This means that for each of these reconstructed x-locations, the deblurring step will shift and sum the same signal from all other corresponding x-locations in separate spectral bins, resulting in multiple reconstructed voxels that may have the same signal. This occurs when the background magnetic field gradient induced by field inhomogeneity is of the same magnitude or larger than the frequency-encoding gradient or when there is a discontinuity in the actual or estimated field-map, leading to substantial pile-up or distortion artifacts in extreme cases. While the weighted-average reconstruction cannot fix pile-up that occurs within a single spectral bin, it can help to reduce the pile-up and distortion that occur across spectral bins by using both the goodness-of-fit field-map and the RF-weighted bin combination. As these extreme artifacts are more likely to occur near the metal when the bin-center frequency is furthest from isocenter, the benefits of the weighted-average reconstruction are likely more pronounced when more spectral bins are acquired and less pronounced when fewer spectral bins are acquired.

FIG. 10 shows that the weighted-average reconstruction may create three relatively minor types of artifacts, arising from sharp discontinuities in the estimated field-map and the subsequent RSOS-weighted, non-linear smoothing of both the field-map and goodness-of-fit. The goodness-of-fit metric is able to account for the vast majority of these field-map inconsistencies through the weighted-average reconstruction, but there are instances where it can lead to small hypointense regions. We believe that smoothing the goodness-of-fit results in noticeably less blurring/artifacts, particularly at tissue boundaries and in regions of extreme inhomogeneity. We note that although these artifacts are far less noticeable and ubiquitous than those found in the center-of-mass reconstruction for our small sample size, further analysis must be done on a much larger set of patients to definitively assess the frequency and clinical impact of these introduced artifacts. Furthermore, although all smoothing parameters were kept constant across all datasets for consistency and fairness in comparing methods, changing the smoothing parameters dynamically, perhaps even for different regions within the same set of images, may noticeably reduce the occurrence of these artifacts.

Goodness-of-Fit Variation

FIG. 9 shows the variation in the overall goodness-of-fit between different datasets. The overall goodness-of-fit can be dependent on many things, including SNR, motion or parallel-imaging artifacts, and the underlying field-map. Other embodiments may determine what scan parameters/factors most improve the goodness-of-fit. Additionally, factors such as low SNR could be taken into account to scale and/or threshold the goodness-of-fit so that it more closely matches the confidence in the field-map estimation in other embodiments.

In summary, various embodiments provide a novel goodness-of-fit field-mapping technique that is less biased by and sensitive to noise than current techniques. The improved field-map and the use of an RF-weighted bin combination scheme are able to improve deblurring and suppress noise and other artifacts from distant spectral bins. Additionally, a goodness-of-fit metric, which indicates the accuracy of the field-map estimate, is used in the proposed weighted-average deblurring algorithm to strike a good balance between distortion and blurring. We have shown in phantoms and in images near knee, hip, and spinal metallic implants, that the various embodiments are able to provide good deblurring without introducing the major distortion artifacts created by the current deblurring technique.

Algorithm

Figure 11:
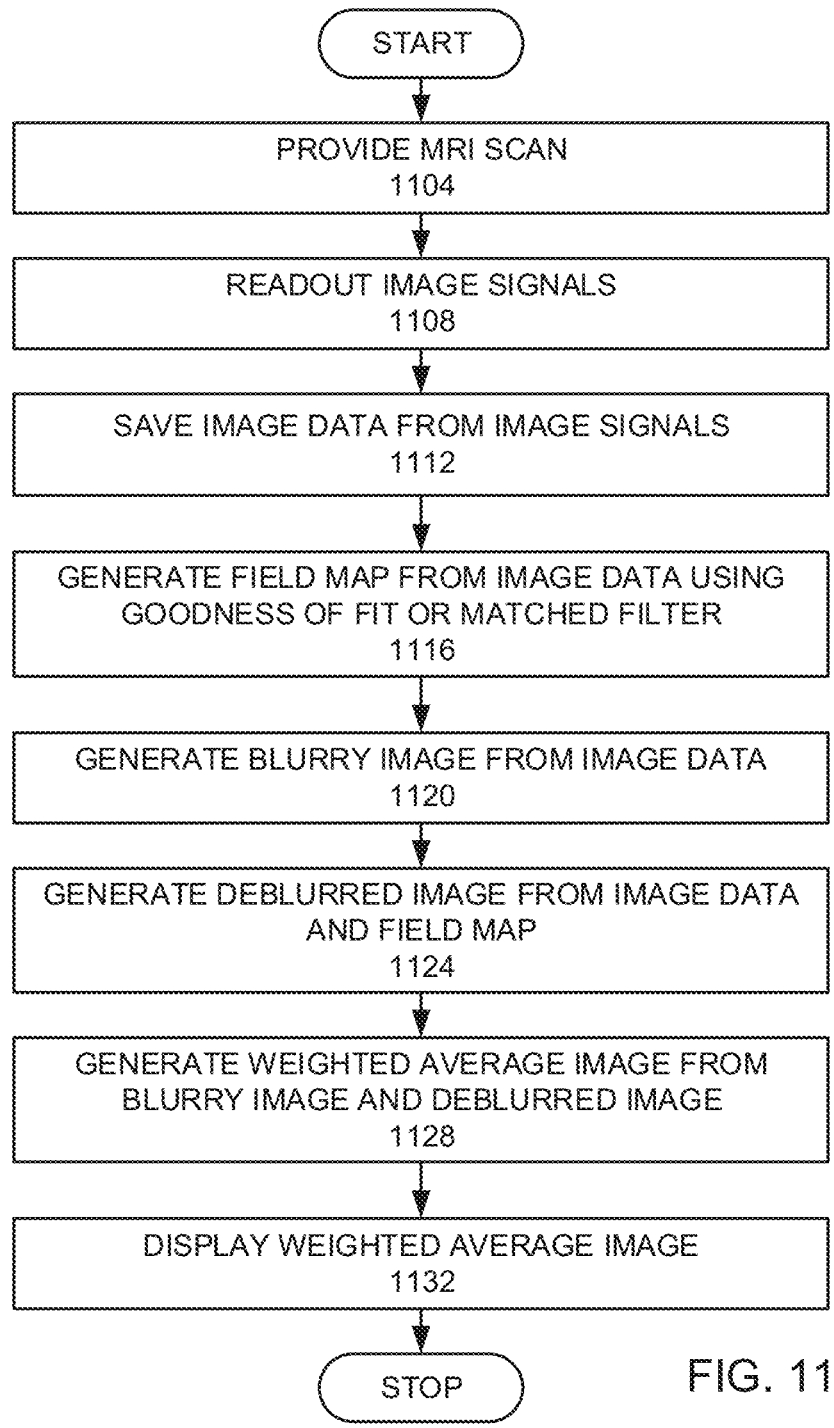
FIG. 11 is a high level flow chart of an embodiment of the invention.

To facilitate understanding, FIG. 11 is a high level flow chart of an embodiment of the invention. An object in an MRI system s scanned by providing multiple excitations of at least part of the object by the MRI system (step 1104). The MRI system reads out image signals from the object (step 1108). The MRI system saves image data from the image signals (step 1112). A field-map is generated from the image data using a goodness-of-fit process, which uses a goodness-of-fit metric and/or a matched-filter to fit expected signals from the excitation to the image data (step 1116). A blurry image is generated from the image data (step 1120). A deblurred image is generated from the image data and field-map by using a spectral image combination that weights each image on a voxel by voxel basis based on a goodness-of-fit (step 1124). A weighted average image is generated from the blurry image and deblurred image based on a goodness-of-fit (step 1128). The weighted image is displayed (step 1132).

Figure 12:
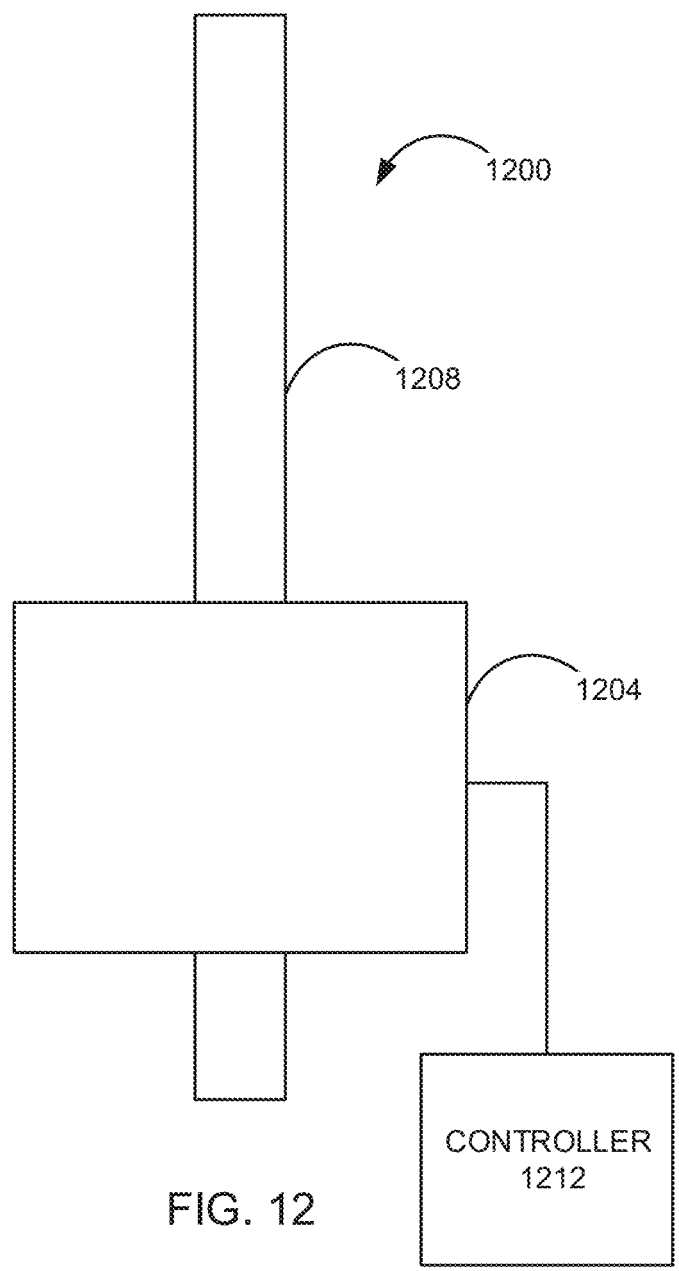
FIG. 12 is a schematic top view of a magnetic resonance imaging (MRI) system that may be used in an embodiment of the invention.

FIG. 12 is a schematic top view of a magnetic resonance imaging (MRI) system 1200 that may be used in an embodiment of the invention. The MRI system 1200 comprises a magnet system 1204, a patient transport table 1208 connected to the magnet system, and a controller 1212 controllably connected to the magnet system. In one example, a patient would lie on the patient transport table 1208 and the magnet system 1204 would pass around the patient. The controller 1212 would control magnetic fields and radio frequency (RF) signals provided by the magnet system 1204 and would receive signals from detectors in the magnet system 1204. In one embodiment, the magnet system 1204 would use a single excitation coil to excite a volume. In another embodiment, the magnet system 1204 would use multiple excitation coils to excite a volume.

Figure 13:
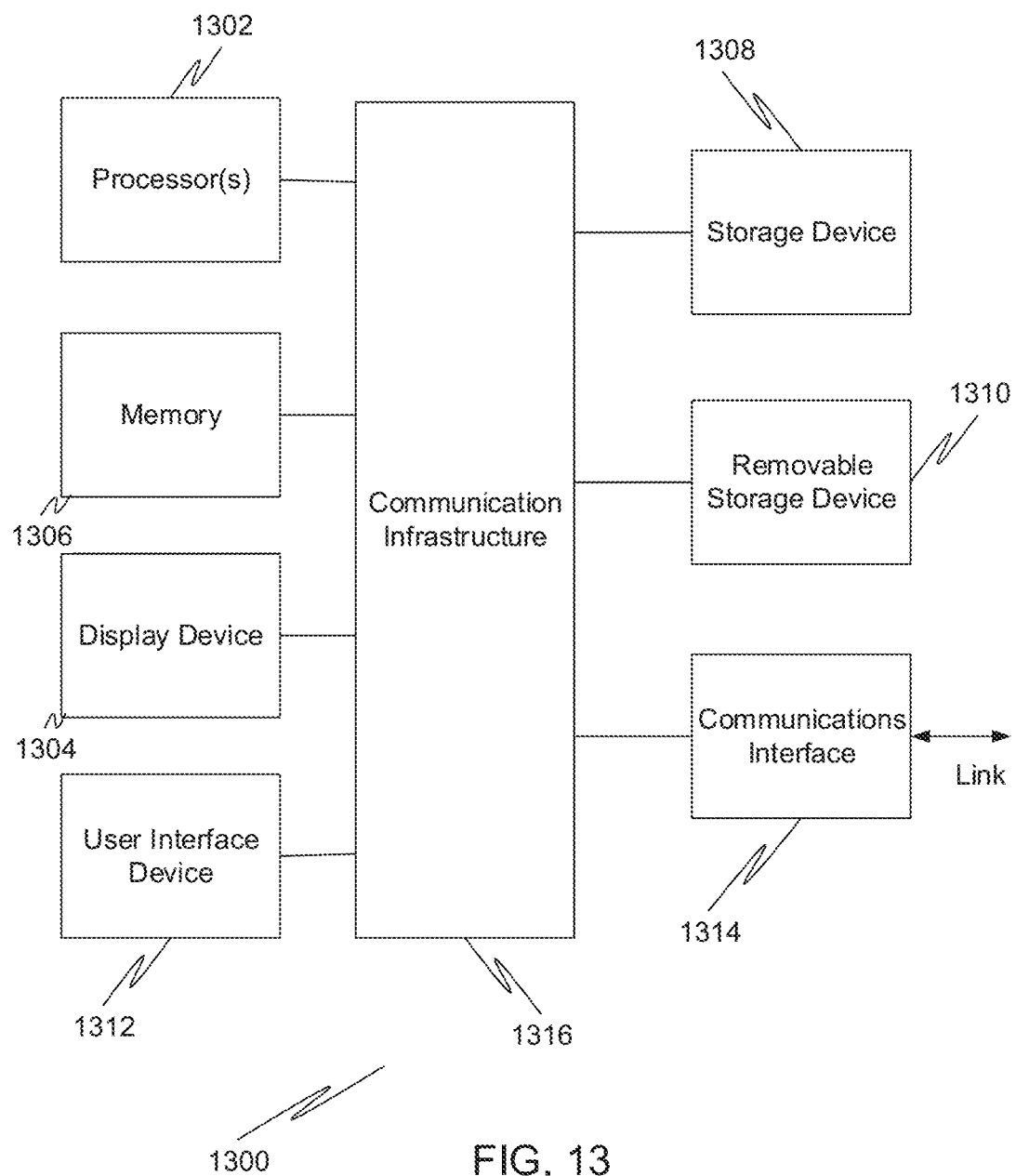
FIG. 13 illustrates a computer system that may be used in an embodiment of the invention.

FIG. 13 is a high-level block diagram showing a computer system 1300, which may be used to provide the controller 1212. The computer system may have many physical forms ranging from an integrated circuit, a printed circuit board, and a small handheld device up to a computer. The computer system 1300 includes one or more processors 1302, and further can include an electronic display device 1304, a main memory 1306 (e.g., random access memory (RAM)), storage device 1308 (e.g., hard disk drive), removable storage device 1310 (e.g., optical disk drive), user interface devices 1312 (e.g., keyboards, touch screens, keypads, mice or other pointing devices, etc.), and a communication interface 1314 (e.g., wireless network interface). The communication interface 1314 allows software and data to be transferred between the computer system 1300 and external devices via a link. The system may also include a communications infrastructure 1316 (e.g., a communications bus, cross-over bar, or network) to which the aforementioned devices/modules are connected.

Information transferred via communications interface 1314 may be in the form of signals such as electronic, electromagnetic, optical, or other signals capable of being received by communications interface 1314, via a communication link that carries signals and may be implemented using wire or cable, fiber optics, a phone line, a cellular phone link, a radio frequency link, and/or other communication channels. With such a communications interface, it is contemplated that the one or more processors 1302 might receive information from a network, or might output information to the network in the course of performing the above-described method steps. Furthermore, method embodiments of the present invention may execute solely upon the processors or may execute over a network, such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an example, a patient may be placed on patient transport table 1208 of the MRI system 1200. The controller 1212 causes the magnet system 1204 scanned a volume of the patient by providing multiple excitations of the volume by the MRI system (step 1104). In this example, the volume of the patient that includes part of a metal hip implant. The multiple excitations are multispectral imaging excitations. Image signals from the volume are read out by the MRI system as image data (step 1108). The image signals are multispectral image signals. The MRI system saves image data from the image signals (step 1112). In this example, the image data is saved either on the controller 1212 or a device in communication with the controller 1212. A field-map is generated from the image data using a goodness-of-fit process, which uses a goodness-of-fit and/or a matched-filter to fit expected signals from the excitation to the image data (step 1116). In this example, a matched-filter field-map is first calculated, then a goodness-of-fit field-map is calculated using the matched-filter field-map. A blurry image is generated from the image data (step 1120). The blurry image is an image that does not use the field-map. A deblurred image is generated from the image data and field-map by using a spectral image combination that weights each image on a voxel by voxel basis based on a goodness-of-fit (step 1124). A weighted average image is generated from the blurry image and deblurred image based on a goodness-of-fit (step 1128). The weighted image is displayed (step 1132). In this example, the weighted image may be displayed on the display device 1304 of the controller 1212 or a device in communication with the controller 1212.

In various embodiments, matched-filters are optimal linear filters for maximizing SNR in the presence of additive stochastic noise. In various embodiments, the matched-filters are determined by searching for the ideal bin signal profile by correlating the acquired spectral bin signal with the expected signal from a given off-resonance frequency. For signal frequencies with a Gaussian distribution, a matched-filter would fit acquired signal data to estimate the peak frequency of the Gaussian, instead of using an average, as used in a center of mass process. In various embodiments, the use of a goodness-of-fit metric determines how closely a spectral bin profile matches an expected bin profile. A field-map estimate that takes into account the varying readout displacements is computed by finding the frequency that maximizes the goodness-of-fit. In various embodiments, the goodness-of-fit field-map is used to remove the bin-specific displacement in regions where the center-of-mass field-map may be noisy or biased. In various embodiments, the goodness-of-fit metric, which indicates the accuracy of the field-map estimate, is used in a weighted-average deblurring algorithm to strike a good balance between distortion and blurring. The goodness-of-fit metric in provides values between 0 and 1, with 0 signifying how closely the Gaussian determined by the matched-filter fits the actual signal data. In some embodiments, a matched-filter field-map is first calculated. Next, a goodness-of-fit field-map is calculated using the matched-filter field-map, since first computing the matched-filter field-map is computationally efficient and generally close to the estimate that maximizes the goodness-of-fit.

Various embodiment use multispectral imaging. Such multispectral imaging provides multiple excitations of multiple spectral bins. Each spectral bin is demodulated at a center frequency of the excited spectrum. As a result, the image data is multispectral image data, in that the image data is collected from the excitations of the multiple spectral bins.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for generating a magnetic resonance image of an object in a magnetic resonance imaging (MRI) system, wherein the object contains at least one metallic implant, comprising:

providing from the MRI system multiple excitations of at least part of the object;

reading out through the MRI system image signals from the object;

saving in the MRI system the readout image signals as image data;

generating a field-map from the image data using a goodness-of-fit process which uses a goodness-of-fit metric, matched-filter, and/or similar fitting techniques to fit expected signals using bin-specific displacements from each excitation to the image data;

generating a blurry or low-resolution image from the image data;

generating a deblurred or high-resolution image from the image data, using the field-map to deblur the image by using a spectral image combination that weights each image on a voxel by voxel basis based on a weighted noise reduction function, wherein the high-resolution image has a higher resolution than the low-resolution image;

generating a weighted image from the blurry image and deblurred image based on a goodness-of-fit; and displaying the weighted image.

2. The method, as recited in claim 1, wherein the goodness-of-fit process uses both a goodness-of-fit metric and a matched-filter to fit expected signals from each excitation to the image data.

3. The method, as recited in claim 2, wherein the goodness-of-fit process comprises:
generating a matched-filter field-map; and
using the matched-filter field-map to generate a goodness-of-fit field-map.

4. The method, as recited in claim 3, wherein the goodness-of-fit metric is used with a weighted-combination deblurring algorithm.

5. The method, as recited in claim 4, wherein the weighted-combination deblurring algorithm is a weighted average deblurring algorithm.

6. The method, as recited in claim 5, wherein the providing from the MRI system multiple excitations of at least part of the object provides multiple excitations of multiple spectral bins.

7. The method, as recited in claim 6, wherein the weighted- image is a multispectral image.

8. The method, as recited in claim 1, wherein the weighted noise reduction function provides a weighting based on expected contribution of each image voxel from the field-map.

9. The method, as recited in claim 8, wherein the weighted image is a weighted average image.

10. The method, as recited in claim 1, wherein the goodness-of-fit process uses both a goodness-of-fit metric and a matched-filter to fit expected signals from each excitation to the image data.

11. The method, as recited in claim 1, wherein the goodness-of-fit process comprises:
generating a matched-filter field-map; and
using the matched-filter field-map to generate a goodness-of-fit field-map.

12. The method, as recited in claim 1, wherein the goodness-of-fit metric is used with a weighted-combination deblurring algorithm.

13. The method, as recited in claim 12, wherein the weighted-combination deblurring algorithm is a weighted average deblurring algorithm.

14. A method for generating a magnetic resonance image of an object in a magnetic resonance imaging (MRI) system, wherein the object contains at least one metallic implant, comprising:
providing from the MRI system multiple excitations of at least part of the object;
reading out through the MRI system image signals from the object;
saving in the MRI system the readout image signals as image data;
generating a field-map from the image data using a goodness-of-fit process which uses a goodness-of-fit metric and/or a matched-filter to fit expected signals using bin-specific displacements from each excitation to the image data;
generating a blurry image from the image data;
generating a deblurred image from the image data, using the field-map to deblur the image by using a spectral image combination that weights each image on a voxel by voxel basis based on an expected contribution of each image voxel from the field-map;
generating a weighted average image from the blurry image and deblurred image based on a goodness-of-fit; and
displaying the weighted average image.

15. The method, as recited in claim 14, wherein the goodness-of-fit process uses both a goodness-of-fit metric and a matched-filter to fit expected signals from each excitation to the image data.

16. The method, as recited in claim 15, wherein the goodness-of-fit process comprises:
generating a matched-filter field-map; and
using the matched-filter field-map to generate a goodness-of-fit field-map.

17. The method, as recited in claim 15, wherein the goodness-of-fit metric is used with a weighted-average deblurring algorithm.

* * * * *